(12) United States Patent
Youn et al.

(10) Patent No.: US 11,935,904 B2
(45) Date of Patent: Mar. 19, 2024

(54) DISPLAY DEVICE

(71) Applicant: LG Display Co., Ltd., Seoul (KR)

(72) Inventors: Sangjin Youn, Paju-si (KR); KyungHyun Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 142 days.

(21) Appl. No.: 17/552,043

(22) Filed: Dec. 15, 2021

(65) Prior Publication Data
US 2022/0208803 A1 Jun. 30, 2022

(30) Foreign Application Priority Data
Dec. 30, 2020 (KR) .................. 10-2020-0186966

(51) Int. Cl.
*H01L 27/12* (2006.01)
(52) U.S. Cl.
CPC ............................. *H01L 27/1248* (2013.01)
(58) Field of Classification Search
None
See application file for complete search history.

(56) References Cited

U.S. PATENT DOCUMENTS

| | | | |
|---|---|---|---|
| 9,356,081 B2 | 5/2016 | Choi | |
| 9,437,167 B2 | 9/2016 | Shin et al. | |
| 10,157,973 B2 | 12/2018 | Choi | |
| 2005/0206821 A1 | 9/2005 | Lai | |
| 2006/0267160 A1* | 11/2006 | Kimura | G02F 1/136286 |
| | | | 257/664 |
| 2006/0279499 A1* | 12/2006 | Park | H10K 59/131 |
| | | | 345/92 |
| 2008/0128699 A1* | 6/2008 | Seong | G02F 1/1345 |
| | | | 257/E27.111 |
| 2010/0265447 A1* | 10/2010 | Seo | G02F 1/134363 |
| | | | 438/34 |
| 2015/0130785 A1 | 5/2015 | Shin et al. | |

(Continued)

FOREIGN PATENT DOCUMENTS

| | | |
|---|---|---|
| CN | 104637443 A | 5/2015 |
| TW | 201521002 A | 6/2015 |

OTHER PUBLICATIONS

United Kingdom Intellectual Property Office, Combined Search and Examination Report, GB Patent Application No. 2118268.8, dated Jun. 14, 2022, eight pages.

(Continued)

*Primary Examiner* — Shan Liu
(74) *Attorney, Agent, or Firm* — Fenwick & West LLP

(57) ABSTRACT

Embodiments of the present disclosure are related to a display device, as a voltage line connection pattern electrically connecting a voltage line and a circuit element in a subpixel includes a first voltage line connection pattern, for example, disposed using an active layer and a second voltage line connection pattern, for example, disposed using a metal layer and not disposed in a part area on the first voltage line connection pattern, a damage of an electrode located at a periphery can be prevented or at least reduced when cutting by a laser for a repair. Furthermore, as the voltage line connection pattern which is easily cut and has a low resistance is disposed, a structure can be provided that is capable of responding to various types of repairs such as a disconnection defect of other signal lines.

20 Claims, 9 Drawing Sheets

(56) References Cited

U.S. PATENT DOCUMENTS

2015/0137099 A1    5/2015  Choi
2016/0247872 A1    8/2016  Choi
2017/0154898 A1*   6/2017  Park ..................... H01L 27/124
2019/0173057 A1    6/2019  Jung et al.

OTHER PUBLICATIONS

Taiwan Intellectual Property Administration, Office Action, TW Patent Application No. 110149326, dated Jan. 9, 2023, 18 pages.

* cited by examiner

DISPLAY DEVICE

CROSS REFERENCE TO RELATED APPLICATION

This application claims priority from Republic of Korea Patent Application No. 10-2020-0186966, filed on Dec. 30, 2020, which is hereby incorporated by reference in its entirety.

BACKGROUND

Field

Embodiments of the present disclosure are related to a display device.

Description of Related Art

The growth of the information society leads to increased demand for display devices to display images and use of various types of display devices, such as liquid crystal display devices, organic light emitting display devices, etc.

The display devices can include a display panel including a plurality of subpixels and a plurality of signal lines. The display devices can include various driving circuits driving the plurality of subpixels and the plurality of signal lines.

When a defect of a circuit element or a signal line located in the subpixel disposed in the display panel occurs, a repair process can be performed. The repair process, for example, can be performed as a method proceeding a cutting or a welding by using a laser.

Thus, in the repair process, there is a problem that a damage of a line or an element located adjacent to an object that requires repair can occur.

SUMMARY

Embodiments of the present disclosure provide methods being capable of preventing or at least reducing damage of a line, an electrode or an element located at a periphery of a repair object (e.g., an object requiring repair) in a process that a defect of a subpixel disposed in a display panel is repaired.

Embodiments of the present disclosure provide a display device having a subpixel structure being capable of repairing various types of defects without dropping a performance of a circuit element or a signal line disposed in the display panel.

In an aspect, embodiments of the present disclosure can provide a display device including a plurality of subpixels disposed in a display panel, a plurality of reference voltage lines supplying a reference voltage to the plurality of subpixels, and a plurality of reference voltage line connection patterns, each of which is electrically connected to a corresponding reference voltage line of the plurality of reference voltage lines and is electrically connected to a thin film transistor disposed in a corresponding pixel among the plurality of subpixels.

Each of the plurality of reference voltage line connection patterns can include a first reference voltage line connection pattern connected to the thin film transistor, and a second reference voltage line connection pattern disposed on a layer different from a layer where the first reference voltage line connection pattern is disposed and electrically connected to the first reference voltage line connection pattern.

The second reference voltage line connection pattern can be disposed in an area excluding a part area of an area overlapped with the first reference voltage line connection pattern.

The second reference voltage line connection pattern may not be connected to the thin film transistor directly.

The second reference voltage line connection pattern is electrically connected to the first reference voltage line connection pattern through a contact-hole located in an area overlapped with a corresponding reference voltage line.

The second reference voltage line connection pattern can include a first part partially overlapped with the reference voltage line and electrically connected to the first reference voltage line connection pattern, and a second part separated from the first part and electrically connected to the first reference voltage line connection pattern.

The first reference voltage line connection pattern included in at least one of the plurality of reference voltage line connection patterns can be a disconnected shape.

The second reference voltage line connection pattern may not be disposed in an area overlapped with a point that the first reference voltage line connection pattern is to be disconnected.

Alternatively, the second reference voltage line connection pattern can be located in an area overlapped with a point that the first reference voltage line connection pattern is disconnected, and the second reference voltage line connection pattern can be electrically connected to the first reference voltage line connection pattern in an area other than an area between the point that the first reference voltage line connection pattern is to be disconnected and the thin film transistor.

In another aspect, embodiments of the present disclosure can provide a display device including a plurality of subpixels disposed in a display panel, a plurality of reference voltage lines supplying a reference voltage to the plurality of subpixels, and a plurality of reference voltage line connection patterns, each of which is electrically connected to a corresponding reference voltage line of the plurality of reference voltage lines, each of the plurality of reference voltage line connection patterns includes a first reference voltage line connection pattern, and a second reference voltage line connection pattern disposed on a layer different from a layer where the first reference voltage line connection pattern is disposed and electrically connected to the first reference voltage line connection pattern, wherein the first reference voltage line connection pattern included in at least one reference voltage line of the plurality of reference voltage line connection patterns is disconnected in an area other than an area overlapped with the second reference voltage line connection pattern included in the at least one reference voltage line.

In another aspect, embodiments of the present disclosure can provide a display device including a substrate, a first voltage line connection pattern located on the substrate and made of a material having a first resistance, and a second voltage line connection pattern located on the first voltage line connection pattern, made of a material having a second resistance less than the first resistance, disposed in an area excluding a part area of an area overlapped with the first voltage line connection pattern, and electrically connected to the first voltage line connection pattern, wherein the first voltage line connection pattern electrically connects a subpixel in the display device and at least one voltage line for supplying a voltage to the subpixel.

According to various embodiments of the present disclosure, as disposing a portion of a signal line which is a cutting object in a repair process among signal lines disposed in a display panel by using an active layer, a cutting with a low power can be possible, and a damage of a line or an electrode located at a periphery of the cutting object can be prevented in a repair process.

According to various embodiments of the present disclosure, by disposing a portion other than a portion cut in the signal line which is a repair object as a double line using a metal layer, a resistance increase of the signal line can be prevented, and the corresponding signal line can be used as a connecting line in a repair process of other signal line.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
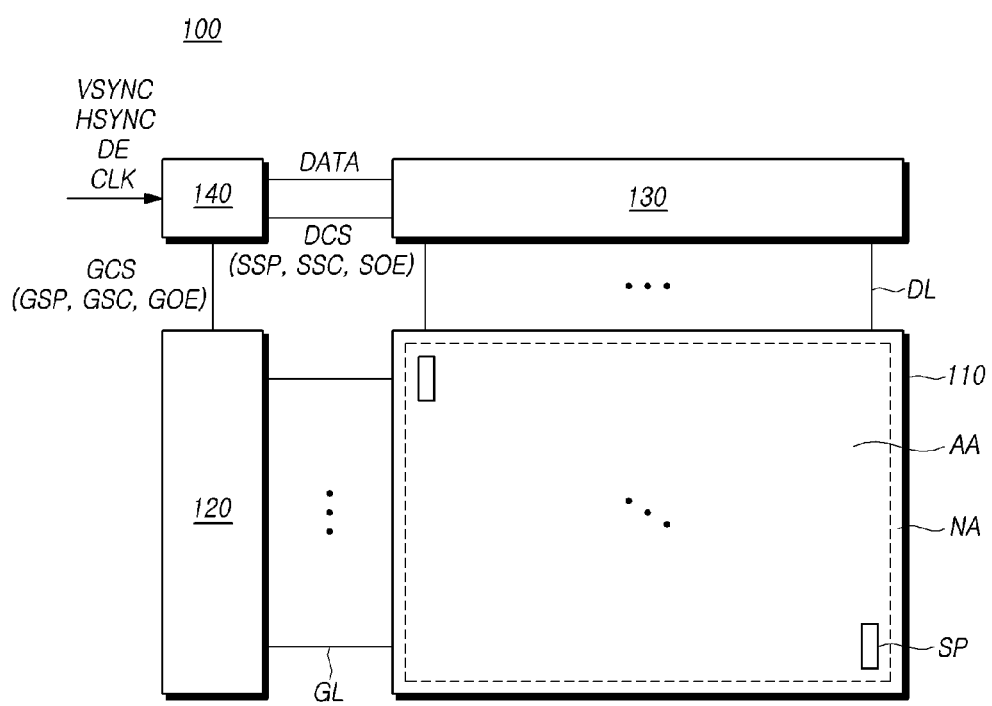
FIG. 1 is a diagram schematically illustrating a configuration of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram schematically illustrating a configuration included in a display device 100 according to embodiments of the present disclosure. All the components of the display device 100 according to all embodiments of the present disclosure are operatively coupled and configured.

Referring to FIG. 1, the display device 100 can include a display panel 110, and a gate driving circuit 120, a data driving circuit 130, and a controller 140 for driving the display panel 110.

The display panel 110 can include an active area AA where a plurality of subpixels SP are disposed, and a non-active area NA which is located outside the active area AA.

A plurality of gate lines GL and a plurality of data lines DL can be arranged on the display panel 110. The plurality of subpixels SP can be located in areas where the gate lines GL and the data lines DL intersect each other.

The gate driving circuit 120 is controlled by the controller 140, and sequentially outputs scan signals to the plurality of gate lines GL arranged on the display panel 110, thereby controlling the driving timing of the plurality of subpixels SP.

The gate driving circuit 120 can include one or more gate driver integrated circuits GDIC, and can be located at one side of the display panel 110, or can be located at both sides thereof according to a driving method.

Each gate driver integrated circuit GDIC can be connected to a bonding pad of the display panel 110 by a tape automated bonding TAB method or a chip-on-glass COG method. Alternatively, each gate driver integrated circuit GDIC can be implemented by a gate-in-panel GIP method to then be directly arranged on the display panel 110. Alternatively, each gate driver integrated circuit GDIC, in some cases, can be integrated and arranged on the display panel 110. Alternatively, each gate driver integrated circuit GDIC can be implemented by a chip-on-film COF method in which an element is mounted on a film connected to the display panel 110.

The data driving circuit 130 receives image data from the controller 140 and converts the image data into an analog data voltage Vdata. The data driving circuit 130 outputs the data voltage Vdata to each data line DL according to the timing at which the scan signal is applied through the gate line GL so that each of the plurality of subpixels SP emits light having brightness according to the image data.

The data driving circuit 130 can include one or more source driver integrated circuits SDIC.

Each source driver integrated circuit SDIC can include a shift register, a latch circuit, a digital-to-analog converter, an output buffer, and the like.

Each source driver integrated circuit SDIC can be connected to a bonding pad of the display panel 110 by a tape automated bonding TAB method or a chip-on-glass COG method. Alternatively, each source driver integrated circuit can be directly disposed on the display panel 110. Alternatively, each source driver integrated circuit SDIC, in some cases, can be integrated and arranged on the display panel 110. Alternatively, each source driver integrated circuit SDIC can be implemented by a chip-on-film COF method. In this case, each source driver integrated circuit SDIC can be mounted on a film connected to the display panel 110, and can be electrically connected to the display panel 110 through wires on the film.

The controller 140 supplies various control signals to the gate driving circuit 120 and the data driving circuit 130, and controls the operation of the gate driving circuit 120 and the data driving circuit 130.

The controller 140 can be mounted on a printed circuit board, a flexible printed circuit, or the like, and can be electrically connected to the gate driving circuit 120 and the data driving circuit 130 through the printed circuit board, the flexible printed circuit, or the like.

The controller 140 can allow the gate driving circuit 120 to output a scan signal according to the timing implemented in each frame. The controller 140 can convert a data signal received from the outside to conform to the data signal format used in the data driving circuit 130 and then output the converted image data to the data driving circuit 130.

The controller 140 receives, from the outside (e.g., a host system), various timing signals including a vertical synchronization signal VSYNC, a horizontal synchronization signal HSYNC, an input data enable DE signal, a clock signal CLK, and the like, as well as the image data.

The controller 140 can generate various control signals using various timing signals received from the outside, and can output the control signals to the gate driving circuit 120 and the data driving circuit 130.

For example, in order to control the gate driving circuit 120, the controller 140 can output various gate control signals GCS including a gate start pulse GSP, a gate shift clock GSC, a gate output enable signal GOE, or the like.

The gate start pulse GSP controls operation start timing of one or more gate driver integrated circuits GDIC constituting the gate driving circuit 120. The gate shift clock GSC, which is a clock signal commonly input to one or more gate driver integrated circuits GDIC, controls the shift timing of a scan signal. The gate output enable signal GOE specifies timing information on one or more gate driver integrated circuits GDIC.

In addition, in order to control the data driving circuit 130, the controller 140 can output various data control signals DCS including a source start pulse SSP, a source sampling clock SSC, a source output enable signal SOE, or the like.

The source start pulse SSP controls a data sampling start timing of one or more source driver integrated circuits SDIC constituting the data driving circuit 130. The source sampling clock SSC is a clock signal for controlling the timing of sampling data in the respective source driver integrated circuits SDIC. The source output enable signal SOE controls the output timing of the data driving circuit 130.

The display device 100 can further include a power management integrated circuit for supplying various voltages or currents to the display panel 110, the gate driving circuit 120, the data driving circuit 130, and the like or controlling various voltages or currents to be supplied thereto.

Each of the plurality of subpixels SP can be an area defined by the intersection of the gate line GL and the data line DL, and at least one circuit element including an element emitting a light can be disposed on the subpixel SP.

For example, in the case that the display device 100 is an organic light-emitting display device, an organic light-emitting diode OLED and a plurality of circuit elements can be disposed in each of the plurality of subpixels SP. The display device 100 drives the plurality of circuit elements to control a current supplying to the organic light-emitting diode OLED disposed in the subpixel SP, and can control that each subpixel SP represents a luminance corresponding to the image data.

Figure 2:
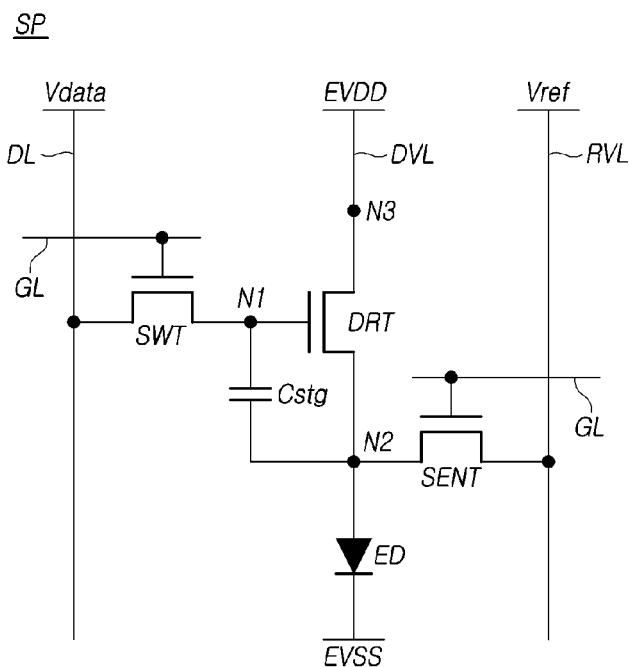
FIG. 2 is a diagram illustrating an example of a circuit structure of a subpixel included in a display device according to embodiments of the present disclosure.

FIG. 2 is a diagram illustrating an example of a circuit structure of the subpixel SP included in the display device 100 according to embodiments of the present disclosure.

FIG. 2 illustrates the example of the circuit structure of the subpixel SP in the case that the display device 100 is the organic light-emitting display device, but embodiments of the present disclosure can be applied to different types of display devices.

Referring to FIG. 2, a light-emitting element ED and a driving transistor DRT for driving the light-emitting element ED can be disposed in the subpixel SP. Furthermore, at least one circuit element other than the light-emitting element ED and the driving transistor DRT can be further disposed in the subpixel SP.

For example, such as the example illustrated in FIG. 2, a switching transistor SWT, a sensing transistor SENT and a storage capacitor Cstg can be further disposed in the subpixel SP.

Thus, the example illustrated in FIG. 2, illustrates a 3T1C structure that three thin film transistors and one capacitor are disposed other than the light-emitting element ED in the subpixel SP as an example, but embodiments of the present disclosure aren't limited to this. Furthermore, the example illustrated in FIG. 2, illustrates a case that all of the thin film transistors are N types as an example, but in some cases, the thin film transistors disposed in the subpixel SP can be P types.

The switching transistor SWT can be electrically connected between the data line DL and a first node N1.

The data voltage Vdata can be supplied to the subpixel SP through the data line DL. The first node N1 can be a gate node of the driving transistor DRT.

The switching transistor SWT can be controlled by the scan signal supplied to the gate line GL. The switching transistor SWT can control that the data voltage Vdata supplied through the data line DL is applied to the gate node of the driving transistor DRT.

The driving transistor DRT can be electrically connected between a driving voltage line DVL and the light-emitting element ED.

A first driving voltage EVDD can be supplied to a third node N3 through the driving voltage line DVL. The first driving voltage EVDD, for example, can be a high potential voltage. The third node N3 can be a drain node or a source node of the driving transistor DRT.

The driving transistor DRT can be controlled by a voltage applied to the first node N1. And the driving transistor DRT can control a driving current supplied to the light-emitting element ED.

The sensing transistor SENT can be electrically connected between a reference voltage line RVL and a second node N2.

A reference voltage Vref can be supplied to the second node N2 through the reference voltage line RVL. The second node N2 can be the source node or the drain node of the driving transistor DRT.

The sensing transistor SENT can be controlled by the scan signal supplied to the gate line GL. The gate line GL controlling the sensing transistor SENT can be the same as the gate line GL controlling the switching transistor SWT, or different from that.

The sensing transistor SENT can control the reference voltage Vref applied to the second node N2. Furthermore, the sensing transistor SENT, in some cases, can be controlled to sense a voltage of the second node N2 through the reference voltage line RVL.

The storage capacitor Cstg can be electrically connected between the first node N1 and the second node N2. The storage capacitor Cstg can maintain the data voltage Vdata applied to the first node N1 during one frame.

The light-emitting element ED can be electrically connected between the second node N2 and a line supplied with a second driving voltage EVSS. The second driving voltage EVSS, for example, can be a low potential voltage.

When the scan signal of a turned-on level is applied to the gate line GL, the switching transistor SWT and the sensing transistor SENT can be turned-on. The data voltage Vdata can be applied to the first node N1, and the reference voltage Vref can be applied to the second node N2.

The driving current supplied by the driving transistor DRT can be determined according to a difference between a voltage of the first node N1 and a voltage of the second node N2.

The light-emitting element ED can represent a luminance according to the driving current supplied through the driving transistor DRT.

Various lines supplying a signal or a voltage to the subpixel SP can be electrically connected to two or more subpixels SP. Being connected electrically to the subpixel SP can mean to be electrically connected to a circuit element or a signal line pattern disposed in the subpixel SP.

Figure 3:
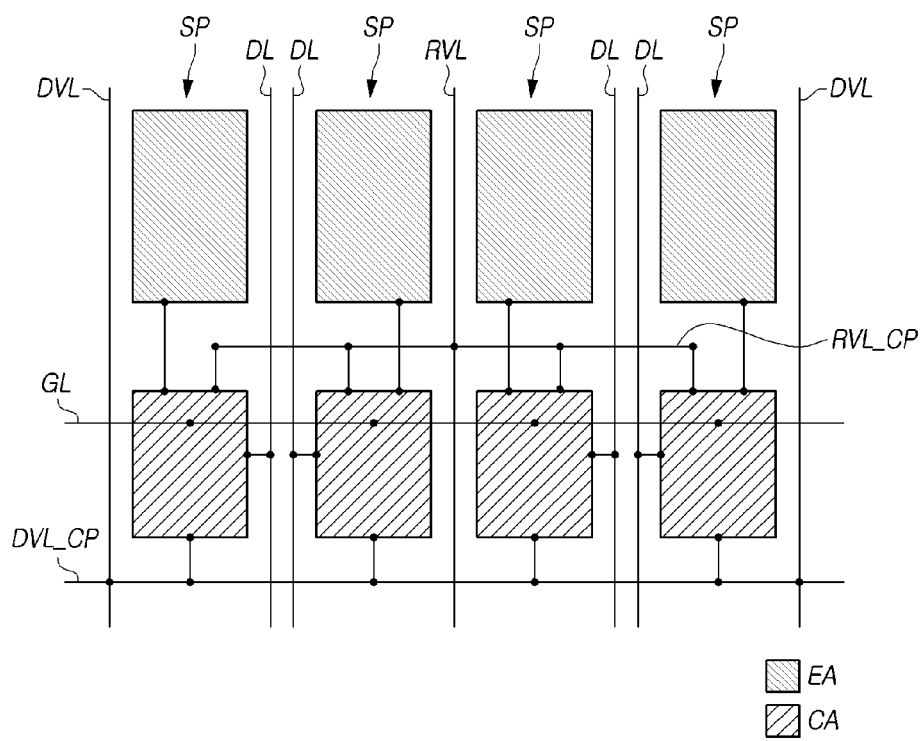
FIG. 3 is a diagram illustrating an example of a connection structure of a subpixel and a signal line included in a display device according to embodiments of the present disclosure.

FIG. 3 is a diagram illustrating an example of a connection structure of the subpixel SP and a signal line included in the display device 100 according to embodiments of the present disclosure.

Referring to FIG. 3, each subpixel SP can include a light-emitting area EA where a light emitted from the light-emitting element ED is output to outside, and a circuit area CA where a circuit element driving the light-emitting element ED is disposed.

In the circuit area CA included in the subpixel SP, for example, the thin film transistor such as the switching transistor SWT, the sensing transistor SENT and the driving transistor DRT described above can be disposed. Furthermore, the storage capacitor Cstg can be disposed in the circuit area CA.

A signal line supplying a signal or a voltage to the subpixel SP can be electrically connected to two or more subpixels SP.

For example, the gate line GL can be electrically connected to two or more subpixels SP disposed along a horizontal direction. The data line DL can be electrically connected to two or more subpixels disposed along a vertical direction.

Other than the data line DL, the driving voltage line DVL supplying the first driving voltage EVDD, and the reference voltage line RVL supplying the reference voltage Vref can be disposed.

For example, the driving voltage line DVL can be disposed on both sides of four subpixels SP. The driving voltage line DVL can be electrically connected to four subpixels SP through a driving voltage line connection pattern DVL_CP. The driving voltage line DVL can supply the first driving voltage EVDD to four subpixels SP located between two driving voltage lines DVL through the driving voltage line connection pattern DVL_CP.

The reference voltage line RVL can be located at a center of four subpixels SP. The reference voltage line RVL can be electrically connected to four subpixels SP through a reference voltage line connection pattern RVL_CP. The reference voltage line RVL can supply the reference voltage Vref to four subpixels SP located on both sides of the reference voltage line RVL through the reference voltage line connection pattern RVL_CP. For example, one or more reference voltage lines RVL corresponding to a reference voltage line connection pattern RVL_CP, that is, one or more reference voltage lines RVL connected to the reference voltage line connection pattern RVL_CP, may be referred to as a "corresponding reference voltage line". In addition, for example, one or more subpixels SP corresponding to a reference voltage line connection pattern RVL_CP, that is, one or more subpixels SP connected to the reference voltage line connection pattern RVL_CP, may be referred to as a "corresponding subpixel".

Alternatively, in some cases, the driving voltage line DVL can supply the first driving voltage EVDD to two or more subpixels SP located on both sides of the driving voltage line DVL. Furthermore, in some cases, the reference voltage line RVL can supply the reference voltage Vref to two or more subpixels SP located between two reference voltage lines RVL.

Although FIG. 3 illustrates an example that the reference voltage line connection pattern RVL_CP connected to the reference voltage line RVL is located between the light-emitting area EA and the circuit area CA, but the reference voltage line connection pattern RVL_CP can be located on a lower side of the subpixel SP such as the driving voltage line connection pattern DVL_CP.

Furthermore, the driving voltage line connection pattern DVL_CP can be located between the light-emitting area EA and the circuit area CA.

Such as described above, an arrangement structure of a signal line electrically connected to the subpixel SP can be various. And in a case that a defect of the light-emitting element ED or the circuit element disposed in the subpixel SP occurs, a repair process for cutting or welding the signal line can be performed.

Figure 4:
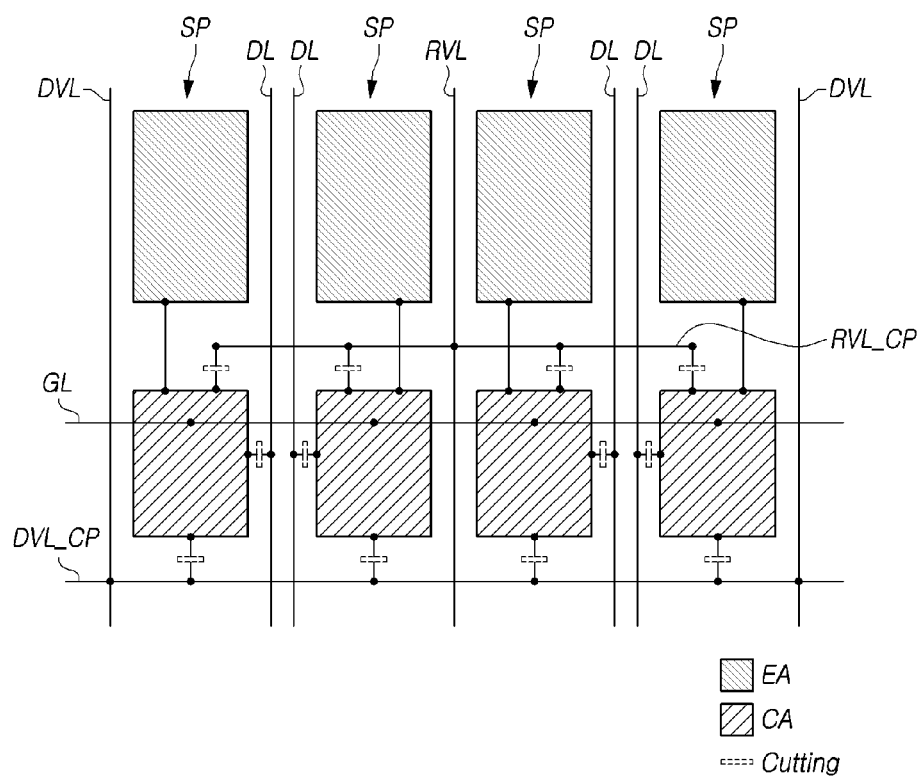
FIG. 4 is a diagram illustrating an example of a structure that a repair process is performed to a subpixel included in a display device according to embodiments of the present disclosure.

FIG. 4 is a diagram illustrating an example of a structure that a repair process is performed to the subpixel SP included in the display device 100 according to embodiments of the present disclosure.

Referring to FIG. 4, it illustrates an example of the repair process making the subpixel SP to be darkened due to the defect of the light-emitting element ED, the circuit element or the signal line disposed in the subpixel SP.

In the repair process, for example, the cutting using a laser can be performed.

In order to darken the subpixel SP, a connection between the signal line supplying a voltage to the subpixel SP and the thin film transistor disposed in the circuit area CA of the subpixel SP can be cut.

For example, the reference voltage line connection pattern RVL_CP can be cut, thereby an electrical connection between the reference voltage line RVL and the circuit area CA disposed in the subpixel SP can be cut.

Furthermore, the driving voltage line connection pattern DVL_CP can be cut, thereby an electrical connection between the driving voltage line DVL and the circuit area CA disposed on the subpixel SP can be cut.

When cutting of the driving voltage line connection pattern DVL_CP, only a portion that the first driving voltage EVDD supplied through the driving voltage line DVL is pulled-in to the driving voltage line connection pattern DVL_CP can be cut. Alternatively, for more secure darkening, such as an example illustrated in FIG. 4, the driving voltage line connection pattern DVL_CP can be cut in an area adjacent to the data line DL.

Furthermore, a portion connecting between the data line DL and the circuit area CA disposed in the subpixel SP can be cut.

A darkened subpixel SP may not be supplied with a voltage supplied for a display driving in the display driving.

Alternatively, as an anode electrode of the light-emitting element ED disposed in the darkened subpixel SP is electrically connected to the driving transistor DRT disposed in an adjacent subpixel SP, a repaired subpixel SP can be driven according to a driving state of the adjacent subpixel SP.

In this case, the data voltage Vdata higher than the data voltage Vdata corresponding to the image data can be supplied to the adjacent subpixel SP which is electrically connected to the repaired subpixel SP and is driven with the repaired subpixel SP for a luminance compensation.

Such as described above, even in the case that a defect of some subpixel SP among the plurality of subpixels SP disposed in the display panel 110 occurs, the display panel 110 can be made as a state that a driving is possible by the repair process.

Furthermore, embodiments of the present disclosure provide methods being capable of preventing or at least reducing that the circuit element, the signal line or an electrode located at a periphery of a repair area are damaged in the repair process.

Figure 5:
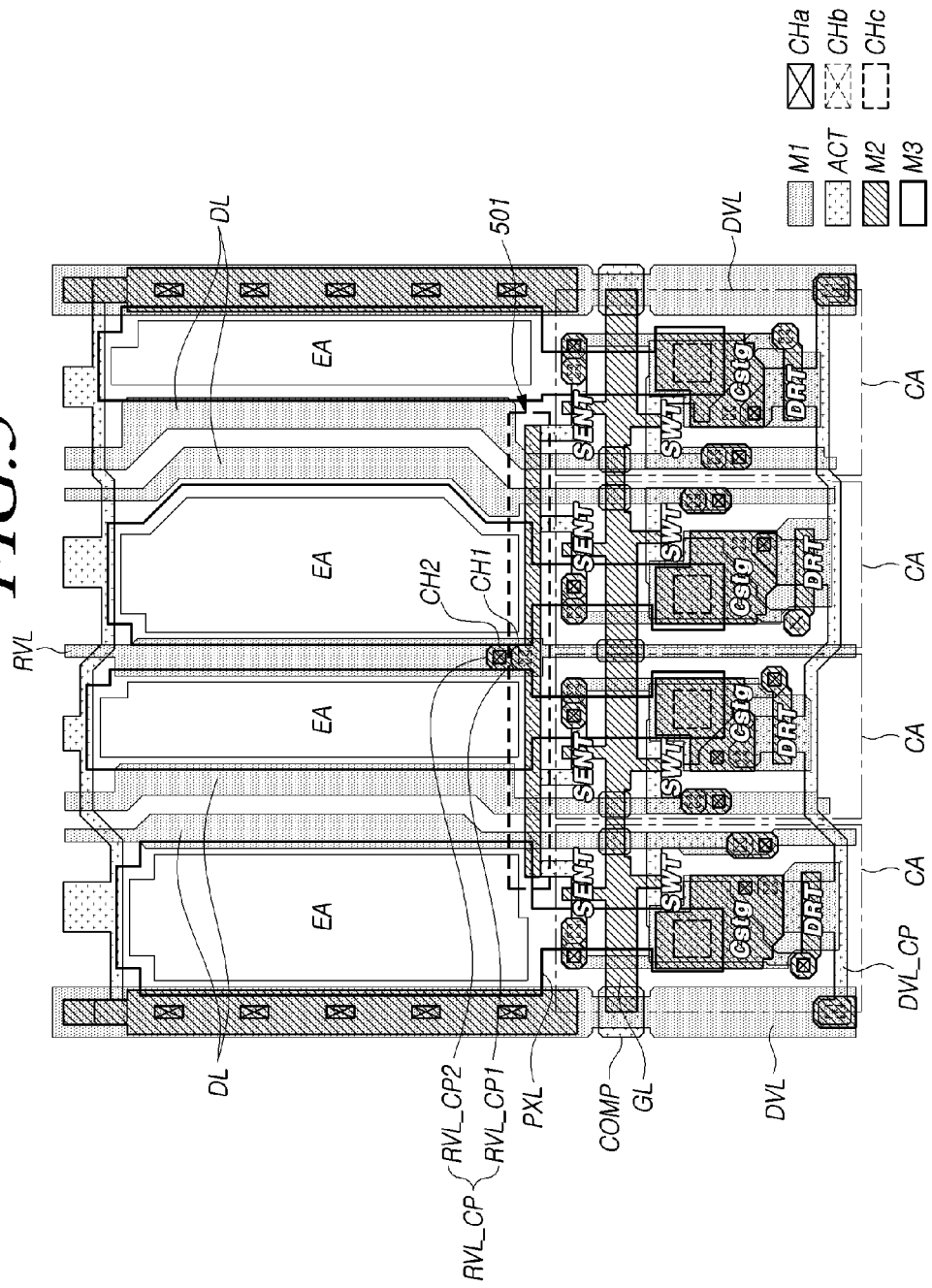
FIG. 5 is a diagram illustrating an example of a specific plane structure of a subpixel included in a display device according to embodiments of the present disclosure.

FIG. 5 is a diagram illustrating an example of a specific plane structure of the subpixel SP included in the display device 100 according to embodiments of the present disclosure.

Referring to FIG. 5, the subpixel SP can include the light-emitting area EA and the circuit area CA. In the circuit area CA, the switching transistor SWT, the sensing transistor SENT, the driving transistor DRT and the storage capacitor Cstg can be disposed.

The signal line and the circuit element disposed in the subpixel SP can be disposed using a plurality of layers.

For example, the driving voltage line DVL, the data line DL, and the reference voltage line RVL can be disposed using a first metal layer M1 located the most adjacent to a substrate.

Furthermore, an electrode of the storage capacitor Cstg disposed in the subpixel SP can be disposed using the first metal layer M1.

An active layer ACT can be located on the first metal layer M1.

At least one insulating layer can be located between the first metal layer M1 and the active layer ACT.

The active layer ACT can constitute a channel region of the thin film transistor disposed in the subpixel SP. The active layer ACT can constitute a source electrode and a drain electrode of the thin film transistor.

The active layer ACT can constitute a line electrically connecting a voltage line and the thin film transistor each other. For example, the reference voltage line connection pattern RVL_CP and the driving voltage line connection pattern DVL_CP can be disposed using the active layer ACT.

Furthermore, the active layer ACT can be disposed in an area where the driving voltage line DVL, the data line DL and the reference voltage line RVL cross the gate line GL to constitute a step-difference compensation pattern COMP.

The active layer ACT, for example, can be made of a semiconductor material. In this case, a line using the active layer ACT can be disposed by conducting process.

Alternatively, the active layer ACT can include a semiconductor layer and a conductive layer disposed on the semiconductor layer. In this case, only the semiconductor layer can be disposed in the channel region of the thin film transistor. For example, by half tone exposure process, the conductive layer may not be disposed in the channel region of the thin film transistor.

A material constituting the semiconductor layer included in the active layer ACT, for example, can be oxide semiconductor. The semiconductor layer can be an oxide of a metal such as a molybdenum Mo, a zinc Zn, an indium In, a gallium Ga, a tin Sn, a titanium Ti, or the like. Alternatively, the semiconductor layer can be made of a combination of a metal such as the molybdenum Mo, the zinc Zn, the indium In, the gallium Ga, the tin Sn, the titanium Ti, or the like and the oxide thereof. Furthermore, the semiconductor layer can be a semiconductor material other than the oxide semiconductor, but embodiments of the present disclosure are not limited to these.

The conductive layer included in the active layer ACT, for example, can include one of a metal such as an aluminum Al, a gold Au, a silver Ag, a copper Cu, a tungsten W, a molybdenum Mo, a chrome Cr, a tantalum Ta, and a titanium Ti or the like or an alloy thereof, but embodiments of the present disclosure are not limited to these.

A second metal layer M2 can be located on the active layer ACT.

At least one insulating layer can be located between the active layer ACT and the second metal layer M2.

The gate line GL can be disposed using the second metal layer M2. A gate electrode of the thin film transistor disposed in the subpixel SP can be disposed using the second metal layer M2. An electrode of the storage capacitor Cstg disposed in the subpixel SP can be disposed using the second metal layer M2. Furthermore, a pattern electrically connected to the driving voltage line DVL can be disposed using the second metal layer M2.

A third metal layer M3 can be located on the second metal layer M2. At least one insulating layer can be located between the second metal layer M2 and the third metal layer M3.

A pixel electrode PXL can be disposed using the third metal layer M3. The pixel electrode PXL can be an anode electrode of the light-emitting element ED.

Various contact-holes can be disposed in the subpixel SP. For example, a plurality of contact-holes CHa disposed to penetrate at least one insulating layer located between the first metal layer M1 and the second metal layer M2 can be disposed in the subpixel SP. A plurality of contact-holes CHb disposed to penetrate at least one insulating layer located between the second metal layer M2 and the active layer ACT can be disposed in the subpixel SP. A plurality of contact-holes CHc disposed to penetrate at least one insulating layer located between the third metal layer M3 and the second metal layer M2 can be disposed in the subpixel SP.

Such as described above, the circuit element and the signal line disposed in the subpixel SP can be disposed using the plurality of layers.

And in the repair process, as disposing a portion to be cut by the laser using the active layer ACT, a cutting process can be performed by the laser with a low power.

For example, such as described above, the driving voltage line connection pattern DVL_CP can be disposed using the active layer ACT. Furthermore, a portion connecting the data line DL and the switching transistor SWT can be also disposed using the active layer ACT.

Furthermore, the reference voltage line connection pattern RVL_CP can be disposed using the active layer ACT.

Thus, as the signal line can be cut in the cutting process by the laser of a low power, damage of an electrode or an element located at a periphery of a cutting object or located over or under the cutting object occurs in the repair process is prevented or at least reduced.

Furthermore, embodiments of the present disclosure can prevent or at least reduce increasing of a resistance of the signal line disposed using the active layer ACT, by disposing a portion of the signal line disposed using the active layer ACT as a double line. Furthermore, as disposing a portion that the cutting is performed by the laser as a single layer using the active layer ACT, easiness of the repair process can be maintained.

For example, such as a portion indicated by 501 illustrated in FIG. 5, a portion of the reference voltage line connection pattern RVL_CP electrically connected to the reference voltage line RVL can be disposed as the double line.

The reference voltage line connection pattern RVL_CP can include a first reference voltage line connection pattern RVL_CP1 and a second reference voltage line connection pattern RVL_CP2.

The first reference voltage line connection pattern RVL_CP1, for example, can be disposed using the active layer ACT.

The first reference voltage line connection pattern RVL_CP1 can be directly connected to the sensing transistor SENT disposed in the subpixel SP. The first reference voltage line connection pattern RVL_CP1 can be electrically connected to the reference voltage line RVL. Furthermore, the first reference voltage line connection pattern RVL_CP1 can be electrically connected to the second reference voltage line connection pattern RVL_CP2.

The second reference voltage line connection pattern RVL_CP2, for example, can be disposed using the second metal layer M2.

The second reference voltage line connection pattern RVL_CP2 can be disposed on a layer different from a layer where the first reference voltage line connection pattern RVL_CP1 is disposed.

The second reference voltage line connection pattern RVL_CP2 can be electrically connected to the first reference voltage line connection pattern RVL_CP1 through at least one contact-hole. Furthermore, in some cases, the second reference voltage line connection pattern RVL_CP2 can be disposed to contact with a top surface of the first reference voltage line connection pattern RVL_CP1.

The second reference voltage line connection pattern RVL_CP2 can be disposed in an area excluding a part area of an area overlapped with the first reference voltage line connection pattern RVL_CP1.

For example, the second reference voltage line connection pattern RVL_CP2 can be disposed in an area other than an area overlapped with an area where the first reference voltage line connection pattern RVL_CP1 is cut in the repair process.

Thus, the second reference voltage line connection pattern RVL_CP2 can be overlapped with a portion of the first reference voltage line connection pattern RVL_CP1. For example, such as an example illustrated in FIG. 5, the second reference voltage line connection pattern RVL_CP2 can be disposed to be overlapped with a portion disposed along the horizontal direction among the first reference voltage line connection pattern RVL_CP1.

In the repair process, as the reference voltage line connection pattern RVL_CP which is cut by the laser includes only the first reference voltage line connection pattern RVL_CP1, the cutting can be performed by using the laser of the low power. During the cutting process by the laser, damage to the other electrode is prevented or at least reduced. Note that, although an example in which the first reference voltage line connection pattern RVL_CP1 is disposed by the active layer ACT has been described above, the present invention is not limited to this, and a suitable material can be selected to form the first reference voltage line connection pattern RVL_CP1 according to actual needs. Similarly, a suitable material can be selected to form the second reference voltage line connection pattern RVL_CP2 according to actual needs.

Furthermore, a resistance of a material constituting the second reference voltage line connection pattern RVL_CP2 can be less than a resistance of a material constituting the first reference voltage line connection pattern RVL_CP1.

Thus, in a case that the reference voltage line RVL is disposed using the active layer ACT for easiness of the repair process, increase of a resistance of a line supplying a voltage is prevented or at least reduced. Furthermore, as the reference voltage line connection pattern RVL_CP includes the second reference voltage line connection pattern RVL_CP2 whose resistance is low, in a case that repairing a disconnection defect of the signal line disposed in the subpixel SP, the reference voltage line connection pattern RVL_CP can be used as a connecting line.

Although embodiments of the present disclosure described above illustrate an example that the reference voltage line connection pattern RVL_CP is disposed as the double line, but a structure that a portion excluding a cutting point is a double line can be applied to a different type of line.

For example, in the case of performing a repair process by the darkening of the subpixel SP, the driving voltage line connection pattern DVL_CP including a portion which is cut by the laser can be disposed as a double line by the active layer ACT and the second metal layer M2. The driving voltage line connection pattern DVL_CP can be disposed by the second metal layer M2 in an area excluding an area overlapped with a cutting area among an area on the driving voltage line connection pattern DVL_CP made of the active layer ACT.

Thus, a resistance of the driving voltage line connection pattern DVL_CP can be reduced, and the cutting by the laser can be performed easily.

Such as described above, embodiments of the present disclosure can reduce a resistance of the reference voltage line connection pattern RVL_CP and prevent that an electrode located at a periphery is damaged when cutting of the reference voltage line connection pattern RVL_CP, as the reference voltage line connection pattern RVL_CP is disposed using the active layer ACT that the cutting by the laser is easy and the second metal layer M2 whose resistance is low.

Furthermore, more various structure of the reference voltage line connection pattern RVL_CP can be provided through a location adjusting of a contact-hole through which the first reference voltage line connection pattern RVL_CP1 and the second reference voltage line connection pattern RVL_CP2 are electrically connected to each other.

For example, such as an example illustrated in FIG. 5, the first reference voltage line connection pattern RVL_CP1 and the second reference voltage line connection pattern RVL_CP2 can be electrically connected through a first contact-hole CH1.

The first contact-hole CH1 can be the contact-hole CHb disposed to penetrate at least one insulating layer located between the active layer ACT and the second metal layer M2.

The first contact-hole CH1 can be located in an area overlapped with the reference voltage line RVL.

The second reference voltage line connection pattern RVL_CP2 can be electrically connected to the reference voltage line RVL through a second contact-hole CH2.

The second contact-hole CH2 can be the contact-hole CHa disposed to penetrate at least one insulating layer located between the first metal layer M1 and the second metal layer M2.

The second contact-hole CH2 can be located in an area overlapped with the reference voltage line RVL.

As the first contact-hole CH1 and the second contact-hole CH2 are located in an area overlapped with the reference voltage line RVL, an increase to an area of the contact-hole disposed in the subpixel SP is prevented or at least reduced due to the reference voltage line connection pattern RVL_CP constituted by a double layer.

Furthermore, as the first reference voltage line connection pattern RVL_CP1 and the second reference voltage line connection pattern RVL_CP2 are electrically connected in an area overlapped with the reference voltage line RVL, a shape of the second reference voltage line connection pattern RVL_CP2 can be disposed to be more various.

Figure 6:
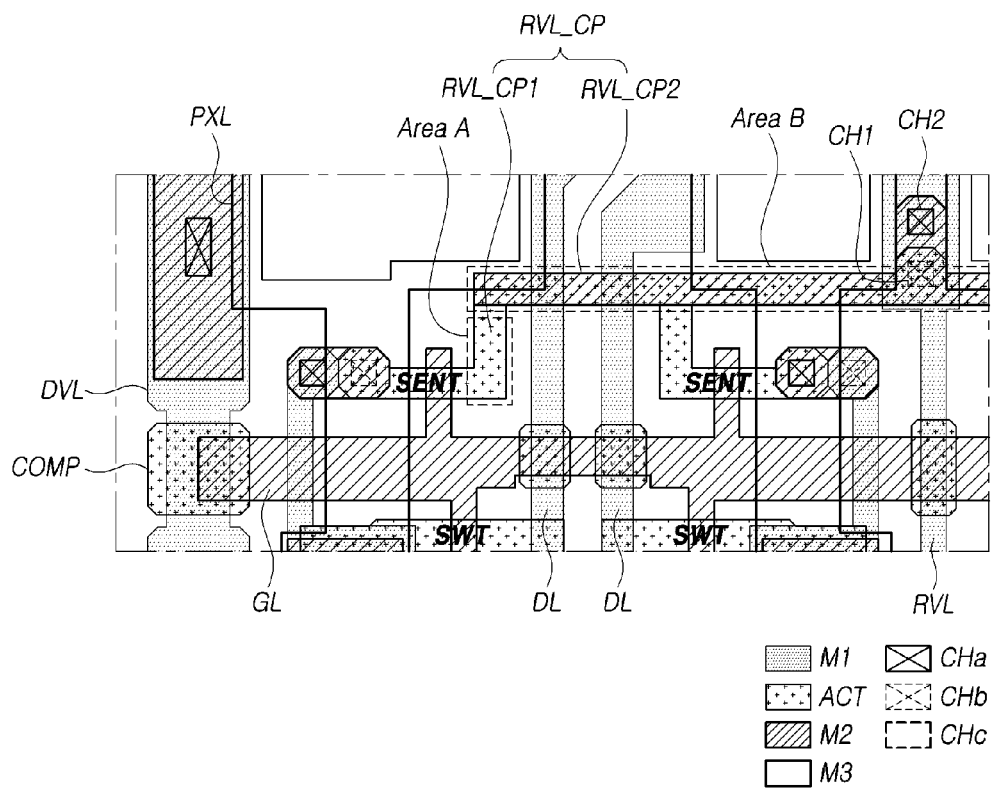
FIGS. 6 to 8 are diagrams illustrating examples of a structure of a reference voltage line connection pattern disposed at a subpixel included in a display device according to embodiments of the present disclosure.
Figure 6:
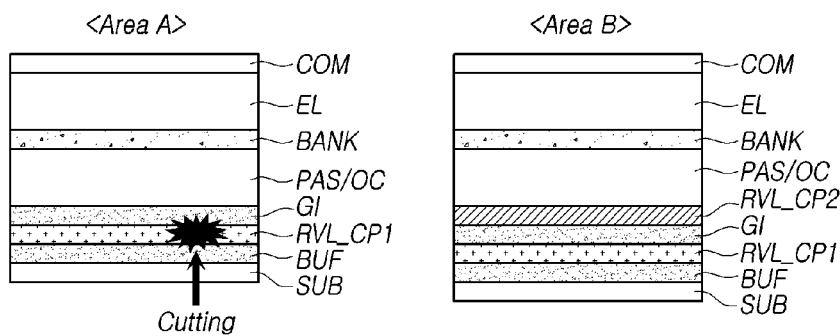
Figure 7:
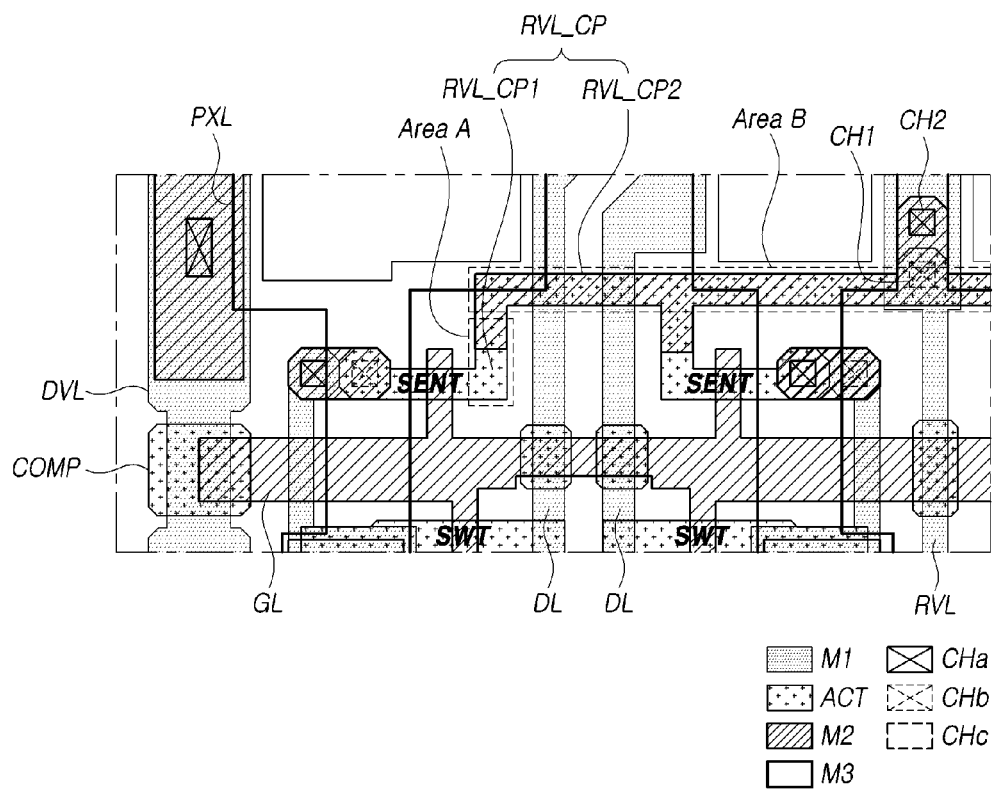
Figure 7:
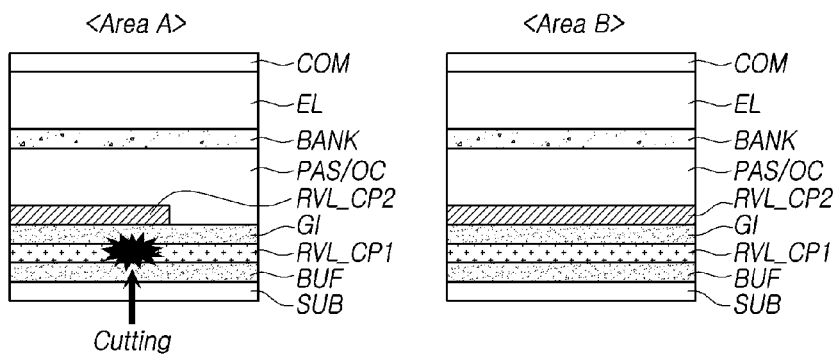
Figure 8:
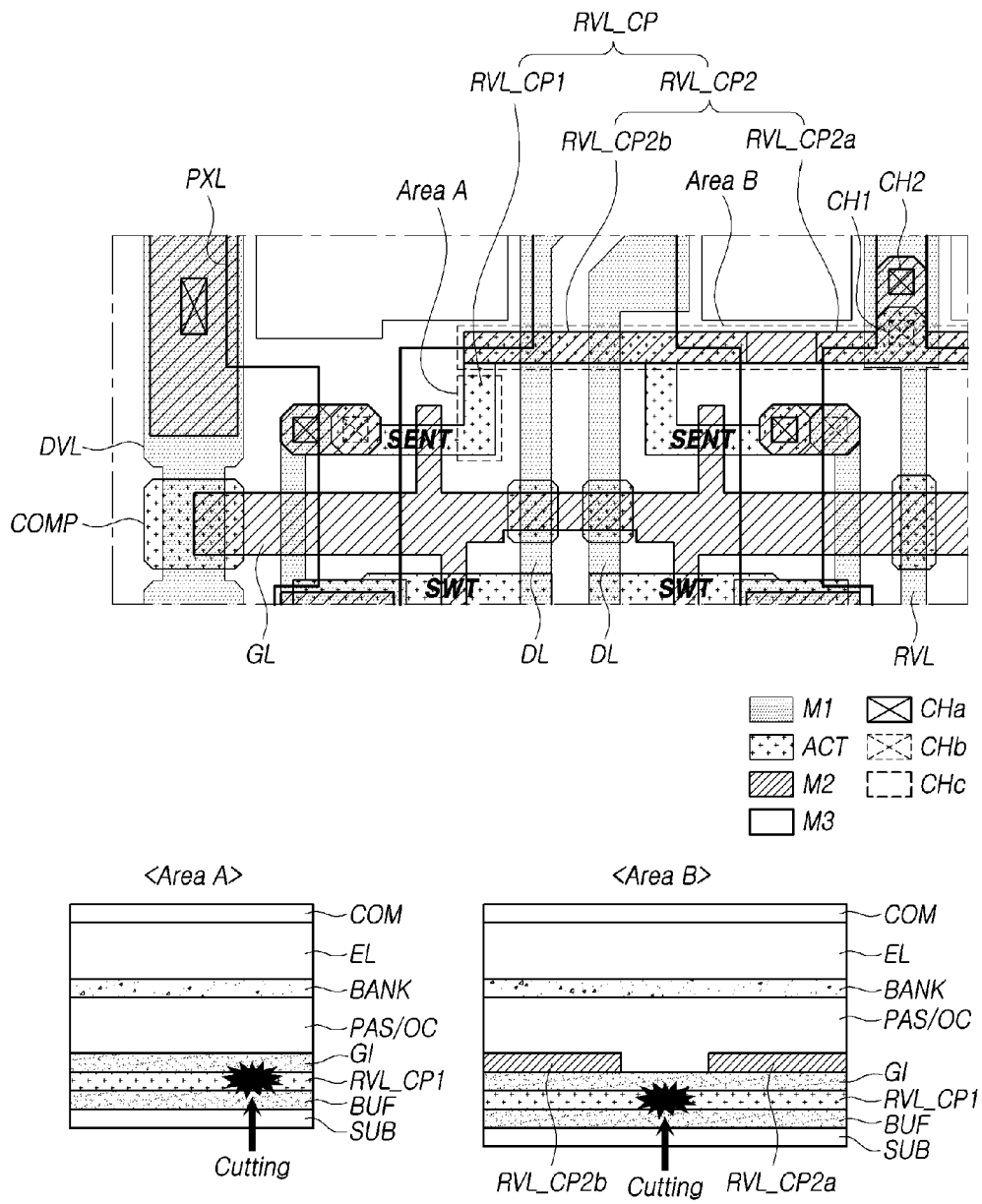

FIGS. 6 to 8 are diagrams illustrating examples of a structure of the reference voltage line connection pattern RVL_CP disposed in the subpixel SP included in the display device 100 according to embodiments of the present disclosure.

Referring to FIG. 6, it illustrates a portion of an area where the reference voltage line connection pattern RVL_CP is disposed.

The reference voltage line connection pattern RVL_CP can include the first reference voltage line connection pattern RVL_CP1 and the second reference voltage line connection pattern RVL_CP2 disposed in a part area on the first reference voltage line connection pattern RVL_CP1.

The first reference voltage line connection pattern RVL_CP1 can be disposed using the active layer ACT.

The first reference voltage line connection pattern RVL_CP1 can be disposed on a buffer layer BUF located on a substrate SUB.

The second reference voltage line connection pattern RVL_CP2 can be disposed using the second metal layer M2.

The second reference voltage line connection pattern RVL_CP2 can be located on the first reference voltage line connection pattern RVL_CP1. A gate insulating layer GI can be located between the second reference voltage line connection pattern RVL_CP2 and the first reference voltage line connection pattern RVL_CP1.

A passivation layer PAS, an overcoat layer OC, a bank layer BANK, a light-emitting layer EL and a common electrode COM or the like can be disposed on the second reference voltage line connection pattern RVL_CP2.

In the repair process, for example, the reference voltage line connection pattern RVL_CP can be cut by the laser irradiated toward a bottom surface of the substrate SUB.

In an area A where the reference voltage line connection pattern RVL_CP is cut, the first reference voltage line connection pattern RVL_CP1 can be disposed only. And, in an area such as an area B other than the area A, the first reference voltage line connection pattern RVL_CP1 and the second reference voltage line connection pattern RVL_CP2 can be disposed.

As only the first reference voltage line connection pattern RVL_CP1 is disposed in the area A, the cutting can be performed by the laser of the low power. Thus, it can be prevented that the common electrode COM or the like disposed on the reference voltage line connection pattern RVL_CP is damaged by the laser.

By a structure that the first reference voltage line connection pattern RVL_CP1 is disposed in the area A and the area B and the second reference voltage line connection pattern RVL_CP2 is disposed on the area B only, the cutting by the laser can be performed easily. Furthermore, as disposing the reference voltage line connection pattern RVL_CP using the active layer ACT and the second metal layer M2, it can be prevented that a resistance of the signal line increases.

The second reference voltage line connection pattern RVL_CP2 can be disposed in an area other than the area A, and can be electrically connected to the first reference voltage line connection pattern RVL_CP1 through at least one contact-hole.

A contact-hole for a connection of the first reference voltage line connection pattern RVL_CP1 and the second reference voltage line connection pattern RVL_CP2 can be located on the reference voltage line RVL. In this case, a structure that the second reference voltage line connection pattern RVL_CP2 is disposed can be various.

Referring to FIG. 7, the reference voltage line connection pattern RVL_CP can include the first reference voltage line connection pattern RVL_CP1 and the second reference voltage line connection pattern RVL_CP2.

The second reference voltage line connection pattern RVL_CP2 can be disposed in a part area on the first reference voltage line connection pattern RVL_CP1.

For example, the first reference voltage line connection pattern RVL_CP1 can be disposed in the area A and the area B. The area A can be an area where the laser is irradiated, and the area B can mean an area other than the area A.

The second reference voltage line connection pattern RVL_CP2 can be disposed at the area B.

Furthermore, the second reference voltage line connection pattern RVL_CP2 can be disposed in a part area of the area A.

As the second reference voltage line connection pattern RVL_CP2 is electrically connected to the first reference voltage line connection pattern RVL_CP1 through a contact-hole located on the reference voltage line RVL, when cutting the first reference voltage line connection pattern RVL_CP1 disposed in the area A, an electrical connection between the reference voltage line RVL and the reference voltage line connection pattern RVL_CP can be cut.

The second reference voltage line connection pattern RVL_CP2 can be electrically connected to the first reference voltage line connection pattern RVL_CP1 in an area other than an area between a disconnection point by the cutting of the first reference voltage line connection pattern RVL_CP1 and the sensing transistor SENT.

Thus, the second reference voltage line connection pattern RVL_CP2 can be disposed in a part area of the area A. Furthermore, in the case of cutting the first reference voltage line connection pattern RVL_CP1 by the laser, the second reference voltage line connection pattern RVL_CP2 can provide a function protecting an electrode or the like located on the second reference voltage line connection pattern RVL_CP2 to be damaged.

Furthermore, as the reference voltage line connection pattern RVL_CP includes the second reference voltage line connection pattern RVL_CP2 whose resistance is low, the reference voltage line connection pattern RVL_CP can be used as the connecting line for repairing a disconnection defect of the signal line disposed in the subpixel SP.

Referring to FIG. 8, the reference voltage line connection pattern RVL_CP can include the first reference voltage line connection pattern RVL_CP1 and the second reference voltage line connection pattern RVL_CP2.

The first reference voltage line connection pattern RVL_CP1 can be disposed at the area A and the area B by using the active layer ACT. The first reference voltage line connection pattern RVL_CP1 can be connected to the sensing transistor SENT disposed in the subpixel SP.

The second reference voltage line connection pattern RVL_CP2 can be disposed using the second metal layer M2 located on the active layer ACT.

The second reference voltage line connection pattern RVL_CP2 may not be disposed at the area A. Alternatively, such as an example described above, the second reference voltage line connection pattern RVL_CP2 can be disposed in a part area of the area A.

The second reference voltage line connection pattern RVL_CP2 can be disposed in a part area of the area B.

The second reference voltage line connection pattern RVL_CP2 can include a portion disconnected in the area B.

Thus, the second reference voltage line connection pattern RVL_CP2 can be a structure separated as two portions. For example, the second reference voltage line connection pattern RVL_CP2 can include a first part RVL_CP2a and a second part RVL_CP2b.

The first part RVL_CP2a of the second reference voltage line connection pattern RVL_CP2 can be electrically connected to the first reference voltage line connection pattern RVL_CP1 through the first contact-hole CH1. The first part RVL_CP2a of the second reference voltage line connection pattern RVL_CP2 can be electrically connected to the reference voltage line RVL through the second contact-hole CH2.

The first part RVL_CP2a of the second reference voltage line connection pattern RVL_CP2 can be separated from the second part RVL_CP2b. The second reference voltage line connection pattern RVL_CP2 can be electrically connected to the first reference voltage line connection pattern RVL_CP1 located in an area overlapping with the second reference voltage line connection pattern RVL_CP2 through at least one contact-hole. Alternatively, in some cases, the second part RVL_CP2b of the second reference voltage line connection pattern RVL_CP2 may not be connected to the first reference voltage line connection pattern RVL_CP1.

In the repair process cutting the reference voltage line connection pattern RVL_CP, the first reference voltage line connection pattern RVL_CP1 disposed in the area A can be cut.

Furthermore, in the case that a repair of other disconnected signal line is performed by using the reference voltage line connection pattern RVL_CP, the first reference voltage line connection pattern RVL_CP1 disposed in the area B can be cut.

As the first reference voltage line connection pattern RVL_CP1 disposed in the area B is cut, a portion of the first reference voltage line connection pattern RVL_CP1 and the second part RVL_CP2b of the second reference voltage line connection pattern RVL_CP2 can be electrically separated from the reference voltage line RVL.

Thus, a separated portion of the first reference voltage line connection pattern RVL_CP1 and the second part RVL_CP2b of the second reference voltage line connection pattern RVL_CP2 can be used for repairing a disconnection defect of other signal line.

Figure 9:
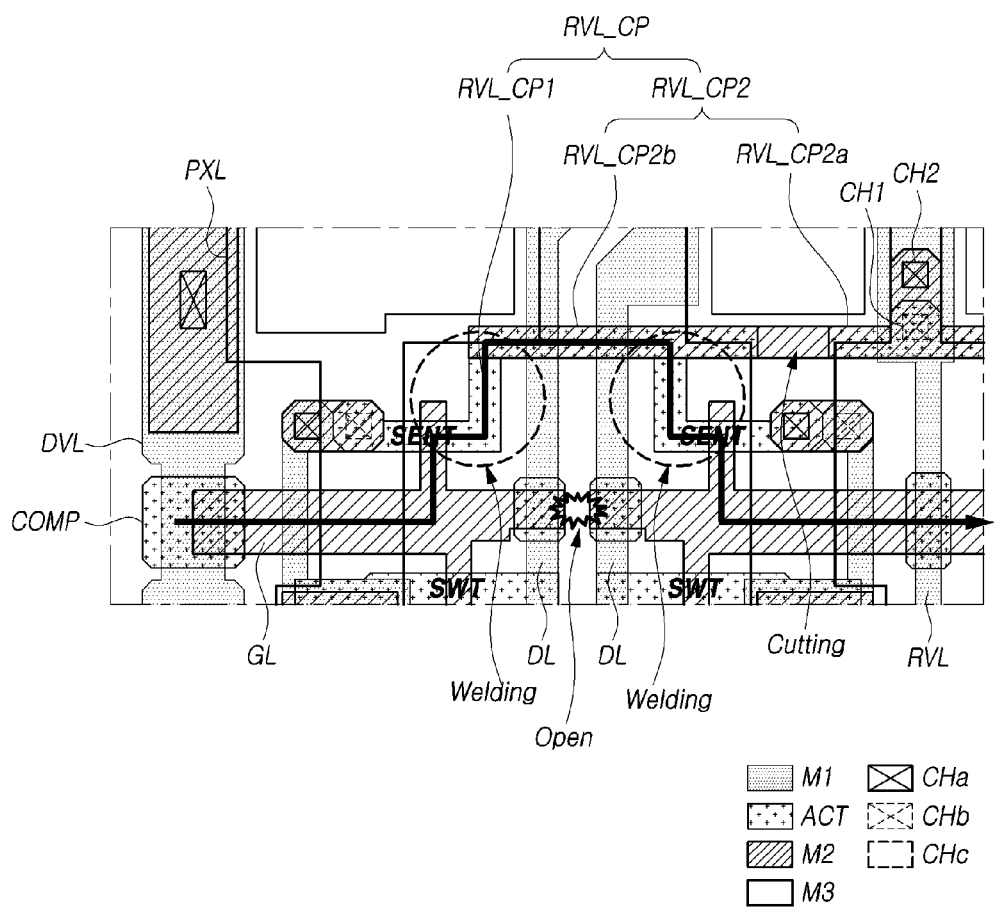
FIG. 9 is a diagram illustrating an example of a structure that a disconnection defect of a gate line is repaired by using the reference voltage line connection pattern illustrated in FIG. 8 according to embodiments of the present disclosure.

FIG. 9 is a diagram illustrating an example of a structure that a disconnection defect of the gate line GL is repaired by using the reference voltage line connection pattern RVL_CP illustrated in FIG. 8.

Referring to FIG. 9, for example, a disconnection defect of the gate line GL supplying the scan signal to the subpixel SP can occur.

In this case, the disconnection defect of the gate line GL can be repaired by using the reference voltage line connection pattern RVL_CP.

In order to repair, the first reference voltage line connection pattern RVL_CP1 located between the first part RVL_CP2a and the second part RVL_CP2b of the second reference voltage line connection pattern RVL_CP2 can be cut.

The separated first reference voltage line connection pattern RVL_CP1 and the second part RVL_CP2b of the second reference voltage line connection pattern RVL_CP2 can be in a state electrically connected through a contact-hole. Alternatively, by welding by the laser, the separated first reference voltage line connection pattern RVL_CP1 and the second part RVL_CP2b of the second reference voltage line connection pattern RVL_CP2 can be electrically connected.

A gate electrode of the sensing transistor SENT connected to the gate line GL and the first reference voltage line connection pattern RVL_CP1 can be welded by the laser.

Thus, the scan signal supplied through the gate line GL can be transfer through a portion of the reference voltage line connection pattern RVL_CP which is separated from other portion of reference voltage line connection pattern RVL_CP and is welded to the gate electrode of the sensing transistor SENT.

Furthermore, as the separated reference voltage line connection pattern RVL_CP includes the second part RVL_CP2b of the second reference voltage line connection pattern RVL_CP2 whose resistance is low, the separated reference voltage line connection pattern RVL_CP can be used as the connecting line for the repair of the gate line GL.

Although the reference voltage line connection pattern RVL_CP electrically connected to the reference voltage line RVL has been mainly described above, another voltage line (such as the driving voltage line DVL for supplying the driving voltage to the subpixel SP, the data line DL for supplying the data voltage to the subpixel SP or the like) may also be electrically connected to a voltage line connection pattern having a structure similar to that of the reference voltage line connection pattern RVL_CP.

According to embodiments of the present disclosure described above, as a portion of the signal line to be cut by the laser in the repair process is constituted by using the active layer ACT, the cutting by the laser of the low power can be possible, and damage to an electrode located at a periphery when cutting is prevented or at least reduced.

Furthermore, as a portion other than a cutting point by the laser is constituted as a multiple layer including at least one metal layer, it can be prevented that a resistance of the signal line constituted by using the active layer ACT increases.

Furthermore, as disposing the signal line that is easy to cut by the laser and has a low resistance in the subpixel SP, a structure being capable of responding to various types of repairs such as the repair of the disconnection defect of other signal line can be provided by using these signal lines.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device, comprising:
   a plurality of subpixels disposed in a display panel;
   a plurality of data lines connected to the plurality of subpixels, the plurality of data lines extending along a first direction in a plan view of the display device;
   a plurality of reference voltage lines supplying a reference voltage to the plurality of subpixels, the plurality of reference voltage lines extending along the first direction; and
   a plurality of reference voltage line connection patterns extending along a second direction that is different from the first direction in the plan view of the display device, each of the plurality of reference voltage line connection patterns is electrically connected to a corresponding reference voltage line of the plurality of reference voltage lines, and is electrically connected to a corresponding thin film transistor disposed in a corresponding subpixel among the plurality of subpixels,
   wherein each of the plurality of reference voltage line connection patterns comprises:
      a first reference voltage line connection pattern connected to the corresponding thin film transistor, the first reference voltage line connection pattern including a portion that extends along the second direction and intersects the corresponding reference voltage line of the plurality of reference voltage lines; and
      a second reference voltage line connection pattern disposed on a layer different from a layer where the first reference voltage line connection pattern is disposed, and electrically connected to the first reference voltage line connection pattern, the second reference voltage line connection pattern including a portion that extends along the second direction and intersects the corresponding reference voltage lines,
   wherein in the plan view of the display device, the portion of the second reference voltage line connection pattern that extends along the second direction overlaps the portion of the first reference voltage line connection pattern that extends along the second direction.

2. The display device of claim 1, wherein the second reference voltage line connection pattern is disposed in an area excluding a part area of an area overlapped with the first reference voltage line connection pattern.

3. The display device of claim 1, wherein the second reference voltage line connection pattern is not directly connected to the corresponding thin film transistor.

4. The display device of claim 1, wherein the second reference voltage line connection pattern is electrically connected to the first reference voltage line connection pattern through a contact-hole, the contact-hole overlapping the corresponding reference voltage line.

5. The display device of claim 1, wherein the first reference voltage line connection pattern included in at least one reference voltage line connection pattern of the plurality of reference voltage line connection patterns is disconnected.

6. The display device of claim 5, wherein the second reference voltage line connection pattern is not disposed in an area overlapped with a point that the first reference voltage line connection pattern is to be disconnected.

7. The display device of claim 5, wherein the second reference voltage line connection pattern is located in an area overlapped with a point that the first reference voltage line connection pattern is to be disconnected, and
   the second reference voltage line connection pattern is electrically connected to the first reference voltage line connection pattern in an area other than an area between the point that the first reference voltage line connection pattern is to be disconnected and the corresponding thin film transistor.

8. The display device of claim 1, wherein the second reference voltage line connection pattern comprises:
   a first part partially overlapped with the corresponding reference voltage line and electrically connected to the first reference voltage line connection pattern; and
   a second part separated from the first part and electrically connected to the first reference voltage line connection pattern.

9. The display device of claim 8, wherein the first reference voltage line connection pattern included in at least one reference voltage line connection pattern of the plurality of reference voltage line connection patterns is disconnected between the first part and the second part included in the second reference voltage line connection pattern included in the at least one reference voltage line connection pattern.

10. The display device of claim 9, wherein the second part included in the second reference voltage line connection pattern included in the at least one reference voltage line connection pattern is electrically connected to a gate line electrically connected to the corresponding thin film transistor.

11. The display device of claim 1, wherein the first reference voltage line connection pattern comprises a semiconductor layer and a conductive layer disposed on the semiconductor layer.

12. The display device of claim 1, wherein a resistance of a material included in the first reference voltage line connection pattern is greater than a resistance of a material included in the second reference voltage line connection pattern.

13. The display device of claim 1, wherein the first reference voltage line connection pattern is located between the second reference voltage line connection pattern and a substrate.

14. The display device of claim 1, wherein at least one insulating layer is disposed between a layer where the first reference voltage line connection pattern is disposed and a layer where the second reference voltage line connection pattern is disposed.

15. The display device of claim 1, wherein the first reference voltage line connection pattern is disposed on a layer same as a layer where an active pattern included in the corresponding thin film transistor is disposed.

16. The display device of claim 1, wherein the second reference voltage line connection pattern is disposed on a layer same as a layer where a gate electrode included in the corresponding thin film transistor is disposed.

17. A display device, comprising:
a plurality of subpixels disposed in a display panel;
a plurality of data lines connected to the plurality of subpixels, the plurality of data lines extending along a first direction in a plan view of the display device;
a plurality of reference voltage lines supplying a reference voltage to the plurality of subpixels, the plurality of reference voltage lines extending along the first direction; and
a plurality of reference voltage line connection patterns extending along a second direction that is different from the first direction in the plan view of the display device, each of the plurality of reference voltage line connection patterns is electrically connected to a corresponding reference voltage line of the plurality of reference voltage lines,
wherein each of the plurality of reference voltage line connection patterns comprises:
a first reference voltage line connection pattern, the first reference voltage line connection pattern including a portion that extends along the second direction and intersects the corresponding reference voltage line of the plurality of reference voltage lines; and
a second reference voltage line connection pattern disposed on a layer different from a layer where the first reference voltage line connection pattern is disposed and the second reference voltage line connection pattern electrically connected to the first reference voltage line connection pattern, the second reference voltage line connection pattern including a portion that extends along the second direction and intersects the corresponding reference voltage line, and
wherein in the plan view of the display device, the portion of the second reference voltage line connection pattern that extends along the second direction overlaps the portion of the first reference voltage line connection pattern that extends along the second direction,
wherein the first reference voltage line connection pattern included in at least one reference voltage line connection pattern of the plurality of reference voltage line connection patterns is disconnected in an area other than an area that the portion of the second reference voltage line connection pattern overlaps the portion of the first reference voltage line connection pattern.

18. The display device of claim 17, wherein at least one insulating layer is disposed between a layer where the first reference voltage line connection pattern is disposed and a layer where the second reference voltage line connection pattern is disposed.

19. The display device of claim 17, wherein a portion of a top surface of the first reference voltage line connection pattern contacts directly with a bottom surface of the second reference voltage line connection pattern.

20. A display device, comprising:
a substrate;
a subpixel on the substrate;
a data line connected to the subpixel, the data line extending along a first direction in a plan view of the display device;
a reference voltage line supplying a reference voltage to the subpixel, the reference voltage line extending along the first direction;
a first voltage line connection pattern located over the substrate, the first voltage line connection pattern comprising a material having a first resistance and including a portion that extends along a second direction and intersects the reference voltage line in the plan view of the display device; and
a second voltage line connection pattern including a portion that extends along the second direction and intersects the reference voltage line and overlaps the portion of the first voltage line connection pattern that extends along the second direction in the plan view of the display device, the second voltage line connection pattern comprising a material having a second resistance that is less than the first resistance, disposed in an area excluding a part area where the portion of the second voltage line connection pattern that overlaps the portion of the first voltage line connection pattern, and electrically connected to the first voltage line connection pattern,
wherein, the first voltage line connection pattern electrically connects the subpixel in the display device and the reference voltage line for supplying the reference voltage to the subpixel.

* * * * *